US006753739B1

(12) United States Patent
Mar et al.

(10) Patent No.: US 6,753,739 B1
(45) Date of Patent: *Jun. 22, 2004

(54) PROGRAMMABLE OSCILLATOR SCHEME

(75) Inventors: Monte F. Mar, Issaquah, WA (US); Warren A. Snyder, Snohomish, WA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/324,455

(22) Filed: Dec. 20, 2002

Related U.S. Application Data

(63) Continuation of application No. 09/721,316, filed on Nov. 22, 2000, now Pat. No. 6,515,551, which is a continuation of application No. 09/275,336, filed on Mar. 24, 1999, now Pat. No. 6,191,660.

(51) Int. Cl.[7] .................................................. H03L 1/00
(52) U.S. Cl. ................... 331/176; 331/175; 331/177 R; 331/66; 331/116 R
(58) Field of Search ................................ 331/183, 176, 331/177 R, 116 R, 175, 66

(56) References Cited

U.S. PATENT DOCUMENTS

| | | | |
|---|---|---|---|
| 4,061,987 A | 12/1977 | Nagahama | 331/111 |
| 4,272,760 A | 6/1981 | Prazak et al. | 341/120 |
| 4,344,067 A | 8/1982 | Lee | 341/347 |
| 4,689,740 A | 8/1987 | Moelands et al. | 364/200 |
| 4,692,718 A | 9/1987 | Roza et al. | 331/113 R |
| 4,868,525 A | 9/1989 | Dias | 331/111 |
| 4,947,169 A | 8/1990 | Smith et al. | 341/121 |
| 5,140,197 A | 8/1992 | Grider | 327/142 |
| 5,150,079 A | 9/1992 | Williams et al. | 331/75 |
| 5,175,884 A | 12/1992 | Suarez | 455/260 |
| 5,200,751 A | 4/1993 | Smith | 341/147 |
| 5,304,955 A | 4/1994 | Atriss et al. | 331/1 R |
| 5,319,370 A | 6/1994 | Signore et al. | 341/120 |
| 5,345,195 A | 9/1994 | Cordoba et al. | 331/111 |
| 5,428,319 A | 6/1995 | Marvin et al. | 331/176 |
| 5,440,305 A | 8/1995 | Signore et al. | 341/120 |
| 5,546,433 A | 8/1996 | Tran et al. | 375/376 |
| 5,552,748 A | 9/1996 | O'Shaughnessy | 331/1 A |

(List continued on next page.)

FOREIGN PATENT DOCUMENTS

| | | |
|---|---|---|
| WO | WO 96/17305 | 6/1996 |
| WO | WO 98/34376 | 8/1998 |
| WO | WO 99/09712 | 2/1999 |

OTHER PUBLICATIONS

"Micropower CMOS Temperature Sensor with Digital Output", By Anton Bakker et al., IEEE Journal of Solid–State Circuits, 31:(7), Jul. 1996, , 2 pages.

"WP 3.5: An Integrated Time Reference", By Robert A. Blauschild, ISSCCS94/Session 3/Analog Techniques/Paper WP 3.5, Digest of Technical Papers, Feb. 16, 1994, pp. 56–58.

"An Analog PLL–Based Block and Data Recovery Circuit with High Input Jitter Tolerance", By Sam Yinshang Sun, Reprinted from IEEE Journal of Solid–State Circuits, vol. SC–24, Apr. 1989, pp. 383–385.

*Primary Examiner*—Arnold Kinkead
(74) *Attorney, Agent, or Firm*—Christopher P. Maiorana, P.C.

(57) ABSTRACT

A circuit including an oscillator circuit, a current generator circuit and a voltage generator circuit. The oscillator circuit may be configured to generate an output signal having a frequency in response to (i) a first control signal and (ii) a second control signal. The current generator may be configured to generate said first control signal in response to a first adjustment signal. The voltage generator circuit may be configured to generate the second control signal in response to a second adjustment signal.

20 Claims, 3 Drawing Sheets

U.S. PATENT DOCUMENTS

| | | | |
|---|---|---|---|
| 5,559,502 A | 9/1996 | Schutte | 340/825.21 |
| 5,604,466 A | 2/1997 | Dreps et al. | 331/113 R |
| 5,670,915 A | 9/1997 | Cooper et al. | 331/111 |
| 5,684,434 A | 11/1997 | Mann et al. | 331/16 |
| 5,689,196 A | 11/1997 | Schutte | 326/86 |
| 5,699,024 A | 12/1997 | Manlove et al. | 331/111 |
| 5,870,004 A | 2/1999 | Lu | 331/176 |
| 5,870,345 A | 2/1999 | Stecker | 365/222 |
| 5,872,464 A | 2/1999 | Gradinariu | 326/71 |
| 5,898,345 A | 4/1999 | Namura et al. | 331/177 V |
| 6,191,660 B1 * | 2/2001 | Mar et al. | 331/111 |
| 6,294,962 B1 * | 9/2001 | Mar | 331/57 |
| 6,515,551 B1 * | 2/2003 | Mar et al. | 331/111 |

\* cited by examiner

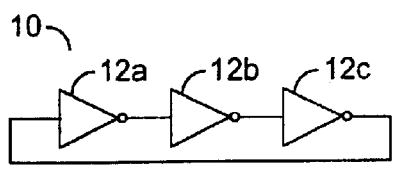
FIG. 1
(CONVENTIONAL)
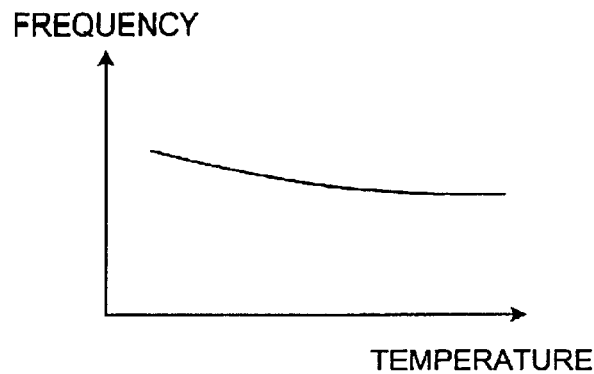
FIG. 2
(CONVENTIONAL)

PROGRAMMABLE OSCILLATOR SCHEME

CROSS-REFERENCE TO RELATED APPLICATION(S)

This is a continuation of U.S. Ser. No. 09/721,316, filed Nov. 22, 2000 now U.S. Pat. No. 6,515,551 which is a continuation of U.S. Ser. No. 09/275,336, filed Mar. 24, 1999, now U.S. Pat. No. 6,191,660.

This application may relate to U.S. Ser. No. 09/207,912, filed on Dec. 9, 1998 now U.S. Pat. No. 6,294,962, which is hereby incorporated by reference in its entirety.

FIELD OF THE INVENTION

The present invention relates to oscillators generally and, more particularly, to a programmable oscillator configured to generate a stable frequency reference on a chip without using external crystals or resonators.

BACKGROUND OF THE INVENTION

One conventional approach used to implement an oscillator without a crystal is to use a simple resistor/capacitor (RC) network to implement a timer. The original 555 timer chip design used an RC network. However, RC networks are susceptible to process variations and temperature variations. A typical mainline CMOS process does not control resistors or capacitors to tolerances of better than 5%. In some processes, the tolerance is even lower. Laser trimming and other techniques can be used to achieve higher tolerances, but may add to the overall cost of the device. An example of a modification of such a circuit can be found in U.S. Pat. Nos. 5,565,819 and 5,670,915, which are hereby incorporated by reference.

A second conventional approach used to implement temperature insensitive current sources is described by R. A. Blauschild in his paper entitled AN INTEGRATED TIME REFERENCE, Proceedings of the IEEE Solid-State Circuits Conference, February 1994, pp. 56–57, which is hereby incorporated by reference. Such an approach develops a temperature invariant current by using a bias generator that sums currents with different temperature coefficients and combines them with a threshold cancellation circuit. The technique allowed a current that was proportional to oxide thickness. This method was applied to time interval measurement and to filtering, but not to oscillator design.

A third conventional approach used to implement an oscillator is to use a ring oscillator that is stable across process and temperature variations. This is often used in timing recovery PLL circuits. The ring oscillator approach appears to be able to achieve frequency stability on the order of 5%, which is not good enough for a target of 2% or less.

Referring to FIG. 1, a portion of a ring oscillator 10 is shown. The ring oscillator 10 comprises a number of devices 12a–12n. FIG. 2 generally illustrates the temperature dependence of the frequency of oscillation of the devices of the ring oscillator 10. The temperature dependence of the ring oscillator 10 adversely affects the frequency of oscillation.

Referring to FIG. 3, a circuit 20 is shown illustrating a biasing circuit for a delay cell that may be used with a conventional ring oscillator. A delay cell 22 generally presents a signal VDD, a signal PBIAS, a signal BIASA, a signal BIASB and a signal VSS to a biasing circuit 24. The biasing circuit 24 may include a current source 26 that responds to the signal PBIAS. The biasing circuit 24 may provide biasing to a voltage reference circuit 28 that is used as a VCO input. Additionally, a bandgap current bias circuit 30 provides additional biasing to the voltage reference 28. However, while the circuit 20 may be roughly temperature independent, it does not generally provide a high precision frequency of oscillation (i.e., less than 2%).

SUMMARY OF THE INVENTION

The present invention concerns an oscillator circuit, a current generator circuit and a voltage generator circuit. The oscillator circuit may be configured to generate an output signal having a frequency in response to (i) a first control signal and (ii) a second control signal. The current generator may be configured to generate said first control signal in response to a first adjustment signal. The voltage generator circuit may be configured to generate the second control signal in response to a second adjustment signal.

The objects, features and advantages of the present invention include providing a circuit and method that may implement a precision on-chip current controlled oscillator. The present invention provides an accurate programmable oscillator that (i) provides accurate frequencies (e.g., in the order of 2% or less), (ii) eliminates the need for a resonator or a crystal oscillator, (iii) may be used with a microcontroller to provide a single-chip clocking solution for an entire system.

BRIEF DESCRIPTION OF THE DRAWINGS

These and other objects, features and advantages of the present invention will be apparent from the following detailed description and the appended claims and drawings in which:

FIG. 1 is a diagram of a conventional ring oscillator;

FIG. 2 is a frequency versus temperature graph illustrating the temperature dependence of a conventional ring oscillator;

DETAILED DESCRIPTION OF THE PREFERRED EMBODIMENTS

The present invention may combine a current-controlled oscillator with a temperature independent current that may be mirrored in a multiplying DAC. The oscillation may be roughly temperature and process independent, and the DAC values may be used to trim the oscillation frequency to a fixed value. The present invention may be stable across temperature and voltage variations. The stability may be achieved by implementing a controlled current to charge a linear capacitor to a controlled voltage level. The stability of the frequency generated may be related to (i) how well the voltage trip level and current are controlled, (ii) how much the comparator propagation delay influences the period, and (iii) how process affects the capacitor value, and thus the frequency of oscillation.

Figure 3:
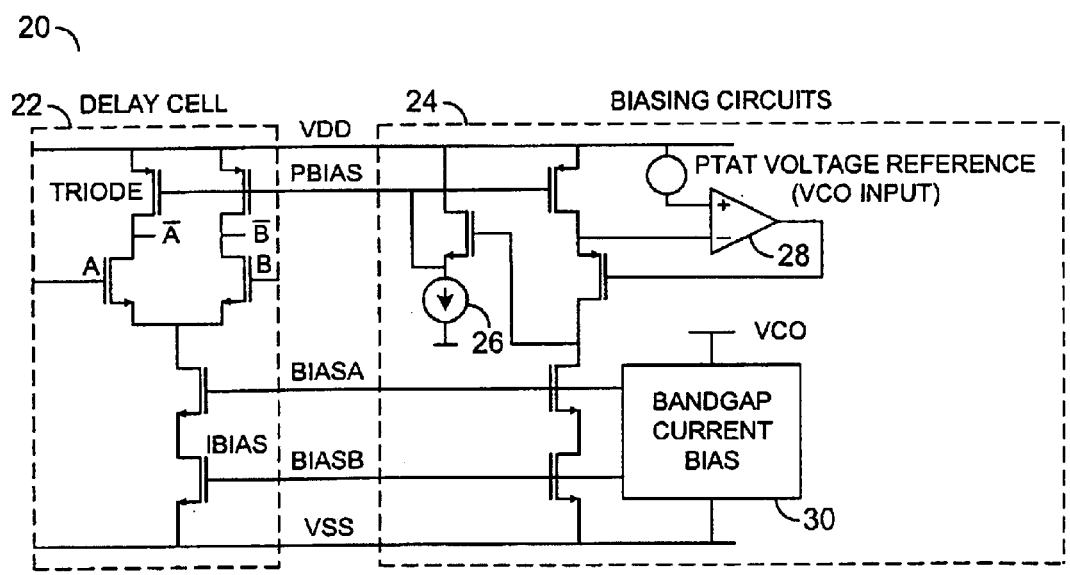
FIG. 3 is a circuit diagram of a conventional biasing circuit for a delay cell.
Figure 4:
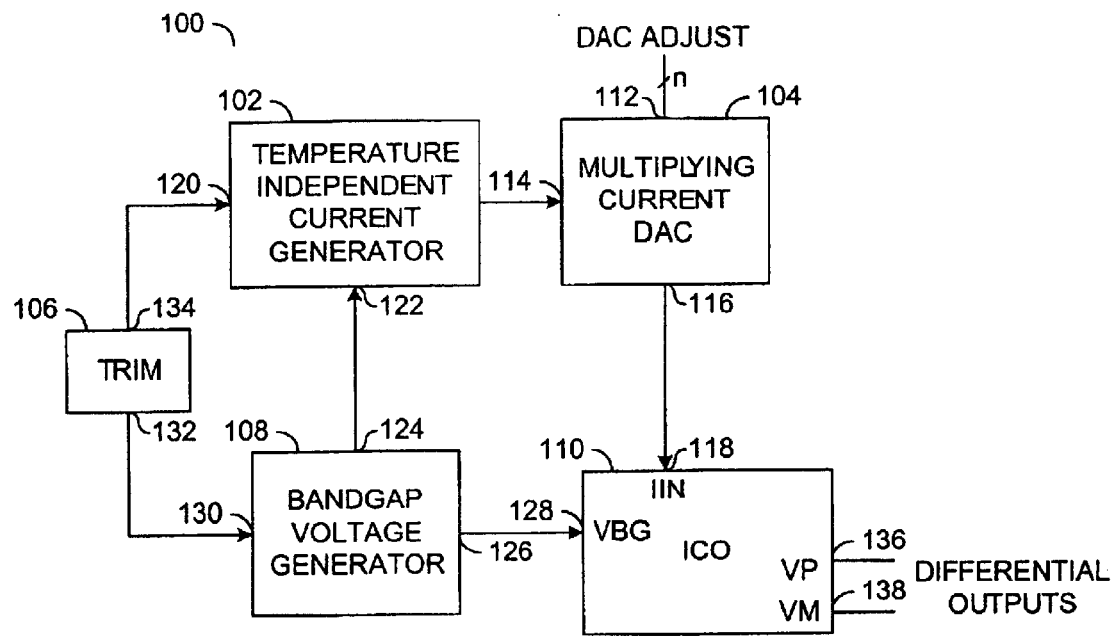
FIG. 4 is a block diagram of a preferred embodiment of the present invention.

Referring to FIG. 4, a block diagram of a circuit 100 is shown in accordance with a preferred embodiment of the present invention. The circuit 100 generally comprises a current source 102, a current multiplying digital to analog converter (DAC) 104, a trim block (or circuit) 106, a bandgap voltage generator 108 and a current controlled oscillator (ICO) 110. The current source 102 may be implemented as temperature independent current generators (to be described in more detail in connection with FIG. 6). The current multiplying DAC 104 may have an input 112 that may receive a multi-bit signal comprising a digital-to-analog converter (DAC) adjustment signal. The current multiplying DAC 104 may also have an input 114 that may receive a signal from the block 102 and an output 116 that may present a signal to an input 118 of the current controlled oscillator 110. The current generator 102 may have an input 120 that may receive the signal from the trim block 106 and an input 122 that may receive a signal from an output 124 of the bandgap voltage generator 108. The bandgap voltage generator 108 may have an output 126 that may present a signal (e.g., VBG) to an input 128 of the current control oscillator 110. The bandgap voltage generator 108 may also have an input 130 that may receive a signal from an output 132 of the trim circuit 106. The trim circuit 106 may also have an output 134 that may present a signal to the input 120 of the current generator 102. The current controlled oscillator 110 may have an output 136 that may present a signal (e.g., VP) and an output 138 that may present a signal (e.g., VM). The signals VP and VM may be differential outputs. The signals VP and VM are generally signals that oscillate at a frequency within a defined target tolerance.

The circuit 100 may be implemented as a current-controlled oscillator (e.g., oscillator 110) with a temperature independent current (e.g., current multiplying DAC 104) that may be controlled by the DAC adjustment signal received at the input 112. The trim circuit 106 generally provides compensation for process variations and the current source 102 generally provides compensation for temperature variations. The trim circuit 106 may comprise one or more memory elements such as flash EEPROM, EPROM, RAM, ROM, or other programmable elements. Thus, the frequency of the signals VP and VM generally depend on the particular process corner and are generally trimmed using the trim circuit 106 and the DAC adjust input 112.

Figure 5:
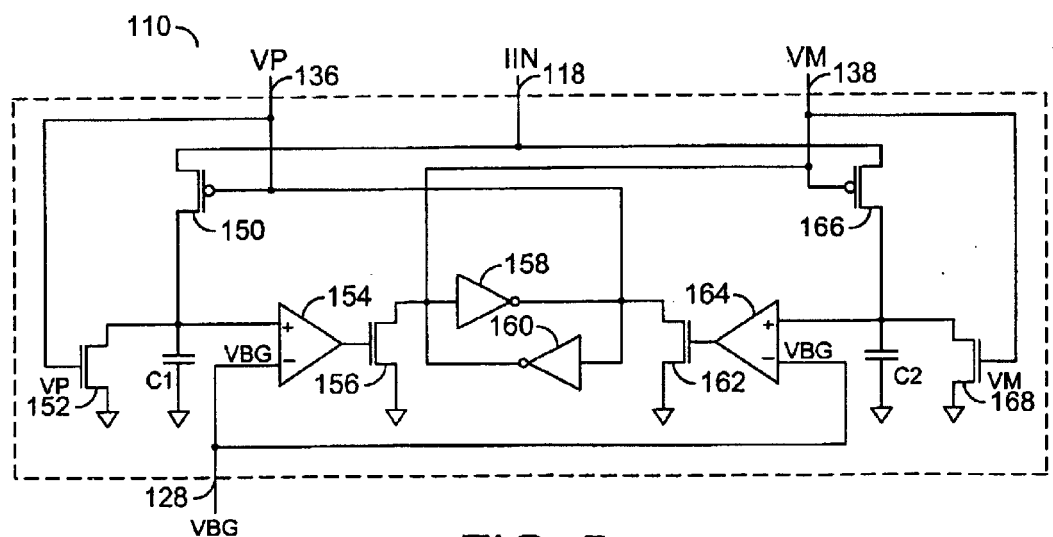
FIG. 5 is a circuit diagram of an example of the current controlled oscillator of FIG. 4.

Referring to FIG. 5, a circuit diagram of the current control oscillator 110 is shown. The ICO 110 generally comprises a transistor 150, a transistor 152, a capacitor C1, a comparator 154, a transistor 156, an inverter 158, an inverter 160, a transistor 162, a comparator 164, a transistor 166, a capacitor C2 and a transistor 168. The transistor 150 generally has a source that may receive a signal (e.g., IIN) from the input 118 and a drain that may be coupled to a source of the transistor 152, a first input of the comparator 154 and ground through the capacitor C1. The transistor 152 may have a drain that may be coupled to ground and a gate that may be coupled to the signal VP at the output 136. The comparator 154 may have a second input that may be coupled to the signal VBG and an output that may be coupled to a gate to the transistor 156. A source of the transistor 156 may be coupled to ground and a drain of the transistor 156 may be coupled to the inverter 158, the signal VM at the output 138, a gate to the transistor 166, and to the output of the inverter 160. A gate of the transistor 150 may be coupled to the input of the inverter 160, the output of the inverter 158 and a drain of the transistor 162. A source of the transistor 162 is generally coupled to ground. The signal IIN may be presented to a drain of the transistor 166. A source of the transistor 166 may be coupled to a first input of the comparator 164, to a source of the transistor 168 and ground through the capacitor C2. A second input of the comparator 164 may be coupled to the signal VBG. A drain of the transistor 168 is generally coupled to ground. A gate of the transistor 168 is generally coupled to the output 138. The signal IIN may be coupled to a feedback of the signals VP and VM through the transistors 150 and 166. The signal VBG may be coupled to the feedback of the signals VP and VM through the comparators 154 and 164.

FIG. 5 illustrates one example of the ICO 110. Other ICO's may be implemented accordingly to meet the design criteria of a particular implementation. For example, the ICO found in the article "An Analog PLL-Based Clock and Data Recovery Circuit with High Input Jitter Tolerance" by Sun from 1989, IEEE Journal of Solid-State Circuits, vol. SC-24, pp. 325–330, may be used in accordance with the present invention.

Figure 6:
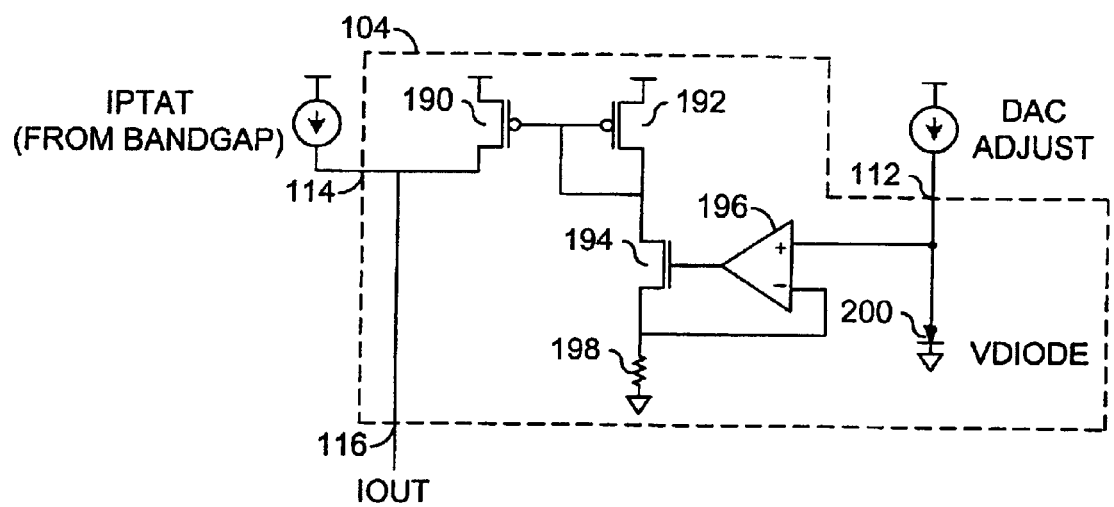
FIG. 6 is a circuit diagram of an example of the temperature independent current source of FIG. 4.

Referring to FIG. 6, a more detailed diagram of the temperature independent current generator 102 is shown. The current generator 102 generally comprises a transistor 190, a transistor 192, a transistor 194, a comparator 196, a resistor 198, and a diode 200. FIG. 6 illustrates one example of the current generator 102. The current generator 102 may also be implemented as temperature independent current source in "Micropower CMOS Temperature Sensor with Digital Output" by Bakker and Huijsing, IEEE Journal of Solid-State Circuits, 31:(7), pp. 933–937, July 1996, which is hereby incorporated by reference in its entirety. The current generator 102 generally sums a proportional to absolute temperature (PTAT) current from a bandgap bias generator with a negative temperature coefficient current generated by forcing the negative temperature coefficient (e.g., VDIODE) across the resistor 198. An example of a bandgap bias generator can be found in U.S. patent application Ser. No. 08/696,008, filed on Aug. 12, 1996 and now U.S. Pat. No. 5,872,464, which is hereby incorporated by reference in its entirety.

In general, process variation may be trimmed by adjusting the DAC values to achieve the desired frequency of oscillation. The current source 102 may be trimmed to improve the temperature coefficients for the voltage and the current. The delay from the comparator 196 may be less of a factor by making the propagation delay small with respect to the period of oscillation and by using biasing schemes that have less variation over temperature. The comparators 154 and 164 in the ICO 110 may contribute the strongest supply sensitivity, since propagation delay is a strong function of the supply voltage VCC. However, if the delay is made small with respect to period of oscillation, the oscillator frequency stability will generally improve.

The signals VP and VM may be differential signals. If the signal VP is high and the signal VM is low, the capacitor C2 is charged up in a linear ramp by the temperature independent current generator 102. When the voltage on capacitor C2 reaches the bandgap voltage VBG, the comparator 164 is generally activated and the signal VP is pulled low, after the propagation delay through the comparator 154. The capacitor C1 then charges to the bandgap voltage VBG and the process repeats, flipping from side to side. The DAC can be used to trim the frequency of operation of the signals VP and VM since the frequency of oscillation is roughly represented by the following equation:

$$Fosc = \frac{I}{2*C*Vbg} \qquad \text{EQ1}$$

In operation, the temperature independent current source 102 may have a slightly positive temperature coefficient to compensate for the gate delay (which may have a positive coefficient), causing the output frequency to have a near zero temperature coefficient. In general, the circuit 100 generates a true 50% duty cycle square wave and may eliminate the device dependent discharge time.

The circuit 100 may be applicable to programmable clock generation. Since a digital word controls the frequency of oscillation of the signal OUT, and since frequency hops can be achieved in a single cycle, it may become possible to jump between precision frequencies by changing the control word value in conjunction with a microcontroller (not shown). These frequency jumps may be broad or minute. A possible application would be to curvature correct the temperature dependence by programming the frequency based on readings from a temperature sensor. An example of a programmable frequency generator that may be used in conjunction with the circuit 100 may be found in U.S. Pat. No. 5,684,434, which is hereby incorporated by reference in its entirety.

The circuit 100 may provide a precision of about 2% over temperature and voltage changes. Using the tuning process and a sufficient sized DAC, trimming may be achieved to within 1% of a target frequency at a given temperature. Such a precision is much better than conventional RC oscillator or a conventional ring oscillator. The circuit 100 may be implemented using a standard CMOS process.

The circuit 100 may be applicable in microcontroller applications. The circuit 100 may allow the microcontroller to provide a single chip clocking solution for a system. For example, a resonator or crystal oscillator may not be needed.

While the invention has been particularly shown and described with reference to the preferred embodiments thereof, it will be understood by those skilled in the art that various changes in form and details may be made without departing from the spirit and scope of the invention.

What is claimed is:

1. A circuit configured to generate an output signal having a frequency comprising:
   a trim circuit configured to generate a first adjustment signal; and
   one or more capacitors configured to charge to a controlled voltage in response to a temperature independent current, wherein said temperature independent current is generated in response to said first adjustment signal.

2. The circuit according to claim 1, wherein said controlled voltage is generated by a band gap voltage generator.

3. The circuit according to claim 1, wherein a current source is configured to generate said temperature independent current in response to (i) said first adjustment signal received from said trim circuit and (ii) a second adjustment signal received from a digital-to-analog converter.

4. The circuit according to claim 3, wherein a band gap voltage generator generates said controlled voltage in response to a third adjustment signal generated by said trim circuit.

5. The circuit according to claim 4, wherein said current source is configured to generate said temperature independent current in response to a fourth adjustment signal generated by said band gap voltage generator.

6. The circuit according to claim 1, wherein said trim circuit comprises a memory element selected from the group consisting of flash EEPROM, EPROM, RAM, ROM, and other programmable elements.

7. The circuit according to claim 4, wherein said trim circuit adjusts said first and third adjustment signals in response to a memory element.

8. The circuit according to claim 1, wherein said temperature independent current and said controlled voltage are generated in further response to a feedback of said output signal.

9. The circuit according to claim 8, wherein said feedback is generated in further response to said one or more capacitors and one or more transistors.

10. The circuit according to claim 9, wherein said feedback is generated in response to:
    a first transistor and a first capacitor configured to generate a positive transition of said feedback signal; and
    a second transistor and a second capacitor configured to generate a negative transition of the feedback signal.

11. The circuit according to claim 1, wherein said circuit comprises a current controlled oscillator.

12. The circuit according to claim 1, wherein said output signal comprises a differential output signal.

13. An oscillator circuit for generating an output signal having a frequency comprising:
    means for generating a first adjustment signal; and
    means for charging one or more capacitors to a controlled voltage using a temperature independent current, wherein said temperature independent current is generated in response to said first adjustment signal.

14. A method of generating an output signal having a frequency comprising the steps of:
    (A) generating a temperature independent current in response to a first adjustment signal, wherein said first adjustment signal is generated by a trim circuit; and
    (B) charging one or more capacitors to a controlled voltage using said temperature independent current.

15. The method according to claim 14 further comprising the step of:
    generating said temperature independent current in response to a second adjustment signal received from a digital-to-analog converter.

16. The method according to claim 15, wherein said controlled voltage is generated by a band gap voltage generator in response to a third adjustment signal generated by said trim circuit.

17. The method according to claim 16, wherein said temperature independent current is generated in response to a fourth adjustment signal generated by said band gap voltage generator.

18. The method according to claim 14, wherein said trim circuit comprises a memory element selected from the group consisting of flash EEPROM, EPROM, RAM, ROM, and other programmable elements.

19. The circuit according to claim 2, wherein a current source is configured to generate said temperature independent current in response to a second adjustment signal received from a digital-to-analog converter.

20. The circuit according to claim 1, wherein said controlled voltage regulates a variation of said frequency of said output signal.

* * * * *